United States Patent [19]

Marom et al.

[11] Patent Number: 4,739,496
[45] Date of Patent: Apr. 19, 1988

[54] ASSOCIATIVE HOLOGRAPHIC MEMORY APPARATUS EMPLOYING PHASE CONJUGATE MIRRORS

[75] Inventors: Emanuel Marom, Beverly Hills; Bernard H. Soffer, Pacific Palisades; Yuri Owechko; Gilmore J. Dunning, both of Newbury Park; David M. Pepper; Marvin B. Klein, both of Malibu; Richard C. Lind, Woodland Hills, all of Calif.

[73] Assignee: Hughes Aircraft Company, Los Angeles, Calif.

[21] Appl. No.: 786,884

[22] Filed: Oct. 11, 1985

[51] Int. Cl.[4] .................. G11C 13/04; G11C 15/00; G03H 1/02
[52] U.S. Cl. .................. 365/125; 365/49; 350/3.6; 356/347
[58] Field of Search .............. 365/125, 124, 121, 120, 365/216, 49; 350/3.6, 3.64, 3.83, 354; 356/347, 348, 354

[56] References Cited

U.S. PATENT DOCUMENTS

| | | | |
|---|---|---|---|
| 3,600,054 | 8/1971 | Gabor | 350/3.5 |
| 3,614,191 | 10/1971 | Sakaguchi et al. | 365/49 |
| 4,005,935 | 2/1977 | Wang | 356/354 |
| 4,275,454 | 6/1981 | Klooster, Jr. | 365/216 |
| 4,529,273 | 7/1985 | Cronin-Golomb et al. | 350/354 |
| 4,598,973 | 7/1986 | Greenleaf | 350/3.6 |

OTHER PUBLICATIONS

Pepper, "Nonlinear Optical Phase Conjugation", Optical Engineering, Mar./Apr. 1982, vol. 21, No. 2, pp. 156-183.
Yariv, "Phase Conjugate Optics and Real-Time Holography", IEEE Journal of Quantum Electronics, vol. QE-14, No. 9, Sep. 1978, pp. 650-660.
Gabor, "Associative Holographic Memories", IBM Journal of Research and Development, vol. 13, No. 2, Mar. 1969, pp. 156-159.

*Primary Examiner*—Stuart N. Hecker
*Assistant Examiner*—Glenn A. Gossage
*Attorney, Agent, or Firm*—Kenneth W. Float; Viji D. Duraiswamy; A. W. Karambelas

[57] ABSTRACT

Associative holography memory apparatus is disclosed which employs a hologram and two phase conjugate mirrors. The mirrors are arranged to form a conjugate resonator whereby the output image from the apparatus tends to converge to that stored image most closely associated with an input image. Alternate embodiments are described which employ a multiple storage and erasure hologram, and which employ only a single phase conjugate mirror.

12 Claims, 2 Drawing Sheets

ASSOCIATIVE HOLOGRAPHIC MEMORY APPARATUS EMPLOYING PHASE CONJUGATE MIRRORS

BACKGROUND OF THE INVENTION

This invention relates to information storage and retrieval apparatus and, more particularly, to associative memory apparatus.

An associative memory, in which pairs of information patterns are stored in such a way that introduction of one pattern results in the recall of another, has potential applications in logical operations, pattern recognition, and image understanding.

Various types of associative memories have been implemented and reported in the literature. One approach to implementing such memories employs various algorithms for associative recall using matrix algebraic manipulations on a digital computer. Another approach employs holograms, which are inherently optical associative memories in that input reference beams are used to recall associated images.

Recently, a new matrix algebra based associative memory model was described by J. J. Hopfield in his paper "Neural Networks and Physical Systems with Emergent Collective Computational Abilities," Proc. Natl. Academy of Science U.S.A., 1982, Vol. 79, pp. 2554–2558. The Hopfield model utilizes feedback and nonlinear thresholding to force the output pattern to be the stored pattern which most closely matches the input pattern. A major drawback of this model is the large storage and computational effort required for manipulation of an association matrix used in the model. In the instance of storing two dimensional image patterns, a four dimensional matrix is required.

An implementation of the Hopfield model employing optical vector-matrix multiplication has been reported by D. Psaltis and N. Farhat in their paper "A New Approach to Optical Information Processing Based on the Hopfield Model," Optical Society of America Annual Meeting, San Diego, Oct. 1984. Psaltis and Farhat successfully demonstrated the associative recall of one dimensional binary vectors. They also suggested an alternative holographic implementation requiring the use of two identical holograms and a bistable optical amplifier. The input image illuminates the first hologram, generating a reference wave. The reference wave in turn, illuminates the second hologram, generating an estimate of the input image. This estimate is applied to the bistable optical amplifier where portions of it exceeding a predetermined threshold are amplified and directed to illuminate the first hologram along with the input image.

Their specific implementation is limited to the processing of black and white (binary) image information as opposed to the processing of gray-scale image information, and also requires a large area bistable optical amplifier as well as two holograms.

Accordingly, it is an object of the present invention to provide a new associative holographic memory employing only a single hologram.

It is another object of the invention to provide a new associative holographic memory capable of processing gray scale and/or phase encoded image information.

It is yet another object of the invention to provide a new associative holographic memory employing phase conjugate mirrors to provide rapid covergence to the desired image.

SUMMARY OF THE INVENTION

The foregoing and other objects of the invention are accomplished by associative holographic memory apparatus for recalling a stored image using an input image which includes a portion of the stored image. The apparatus includes a hologram having the stored image written thereon simultaneously with a stored-image-associated reference beam. The hologram has the properties of providing a probe reference beam in response to a probe image being incident therein and, in a reciprocal manner, of providing the probe image in response to the probe reference beam being incident therein.

A first phase conjugate mirror is also provided. A first light path is established for conveying the probe reference beam provided by the hologram to the first phase conjugate mirror and for conveying back to the hologram a phase conjugated probe reference beam as generated by the first phase conjugate mirror.

A second phase conjugate mirror is provided, and a second light path is established for conveying the probe image provided by the hologram to the second phase conjugate mirror and for conveying back to the hologram a phase conjugated probe image as generated by the second phase conjugate mirror.

A third light path is provided for conveying the input image to the hologram as a probe image. A fourth light path conveys the phase conjugated probe image as generated by the second phase conjugate mirror to an output image viewing plane.

The first phase conjugate mirror includes a thresholding function whereby a phase conjugate of only those components of the probe reference beam which exceed a predetermined threshold level of beam intensity is conveyed back to the hologram. The first phase conjugate mirror may also include amplification so that the amplitude of the phase conjugated probe reference beam is greater than that of the probe reference beam. The level of amplification can be made sufficient to overcome any undesirable losses in the hologram and the second phase conjugate mirror, whereby a phase conjugate resonator cavity is formed by the combination of the first and second mirrors. The resonator cavity acts to cause the output image to converge to the stored image.

Alternate embodiments of the invention are described which employ a multiple storage and erasure hologram, and which employ only a single phase conjugate mirror.

These and other objects, features and advantages of the invention will become apparent from a reading of the specification when taken in conjuction with the drawings in which like reference numerals refer to like elements in the several views.

DESCRIPTION OF THE PREFERRING EMBODIMENT

Figure 1:
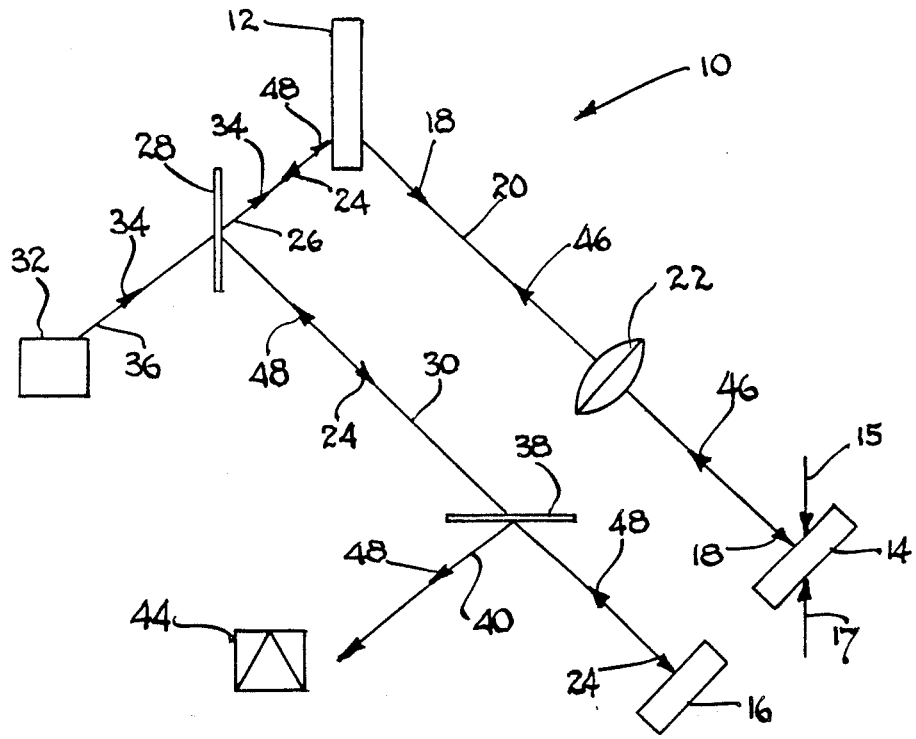
FIG. 1 is a schematic/block diagram of a first embodiment of the invention employing a permanent hologram and two phase conjugate mirrors.

Referring to FIG. 1, there is shown a schematic/block diagram of a first embodiment 10 of the invention which employs a permanent hologram 12 and first and second phase conjugate mirrors (PCMs) 14 and 16, respectively, to form an associative holographic memory.

The hologram 12, which may be in the form of a photographic plate, has stored thereon a plurality of images. Each stored image is written onto the hologram 12 using a unique reference beam associated with that image (hereinafter referred to as a stored-image-associated reference beam). Generally, images are stored on the hologram using plane wave reference beams.

It is a well known property of a hologram that when it is illuminated with a reference beam (hereinafter referred to as a probe reference beam) which corresponds to a stored image associated reference beam, it will produce an image (hereinafter referred to as a probe image) corresponding to the particular stored image to which that probe reference is associated. In a reciprocal manner, when the hologram is illuminated with a probe image corresponding to one of the stored images, the hologram will produce a probe reference beam which is the unique reference beam associated with that particular stored image.

It has also been found that when a probe image containing only a portion of a stored image is used to illuminate a hologram, the resultant probe reference beam generated consists of a composite of reference beams, primarily containing the correct stored-image-associated reference beam. Conversely, when a composite probe reference beam containing only a portion of a stored-image-associated reference beam is used to illuminate a hologram, the resultant probe image generated consists of a composite of stored images, primarily containing the correct stored image associated with that reference beam. These properties of a hologram are used to advantage in the present invention, as described below.

In the early 1970's a new field emerged in the area of coherent optics, known as Nonlinear Optical Phase Conjugation (NOPC). As a result of studies and experiments in that field, remarkable devices known as phase conjugate mirrors (PCMs) have been developed. A rather complete discourse on PCMs, including a thorough list of references in the field of NOPC may be found in a paper by one of the coinventors of the present invention, David M. Pepper, entitled "Nonlinear Optical Phase Conjugation," Optical Engineering, Vol. 21, No. 2, Mar./Apr., 1982 pp. 156-183.

Briefly, a PCM is a device capable of producing a wavefront-reversed replica of a light beam incident on the mirror. This backward-going beam, called a phase-conjugate wave, exactly retraces the path of the incident beam, ultimately returning to the point of origin of that beam.

As an example of the effect of a PCM, consider a diverging beam of light emanating from a point source in space. This spreading light wave will, upon reflection from a PCM, result in a *converging* beam of light which will propagate exactly back to the original point in space. This beam retracing occurs regardless of the angle of incidence of the beam with the PCM. An ordinary flat mirror, on the other hand, changes only the direction of propogation of the incident optical beam. Thus, an incident diverging beam will continue to diverge after reflection from the mirror. Moreover, since the angle of incidence equals the angle of reflection for a flat mirror, a titled mirror doubles the angle of reflection.

From the above discussion, it will be apparent that a PCM may be used to restore the optical fidelity of an incident wave which has been distorted as it propogates from its source to the PCM.

There are two major classes of PCM devices. One class employs the phenomenon of elastic photon scattering in an optically nonlinear medium. This medium may consist of a wide variety of gases (e.g. sodium vapor, carbon dioxide, rubidium vapor), solids (e.g. gallium arsenide, silicon, germanium) or liquids (e.g. chlorophyl, organics) as well as plasmas, liquid crystals and aerosols. A particular type of PCM employing elastic photon scattering involves the interaction of four optical beams in the nonlinear medium. This type of PCM is known as a four wave mixing (FWM) PCM. The four beams involved include the incident input beam, the outgoing conjugate beam, and two input pump waves which act to sensitize the medium. One advantage of a FWM PCM is that it can be configured to amplify the phase conjugate beam so that its amplitude exceeds that of the incident input beam.

Another class of PCM devices employs the phenomenon of inelastic photon scattering in a nonlinear medium. Interactions such as Raman, Brillouin, and Rayleigh scattering fall under this classification. A feature of this class of PCM is its passive nature. The only optical beam required is the input wave to be conjugated. No additional sources (e.g. pump waves) are required. However, the amplitude of the conjugate wave is less than that of the input wave. The above described properties of PCMs are used to advantage in the present invention, as described below.

Both classes of PCMs can also be configured to provide a threshold effect whereby the output beam is a phase conjugate of only those portions of the input beam which exceed a predetermined threshold level of beam intensity.

Returning to FIG. 1, the first PCM 14, which is preferably of the FWM type having input waves 15 and 17, is positioned to receive as an input beam, a hologram generated probe reference wave (depicted in FIG. 1 by arrows 18) from the hologram 12 via light path 20. A focusing lens 22 is positioned so that the probe reference wave 18 is focused on the PCM 14.

The PCM 16, which may be of the inelastic photon scattering type, is positioned to receive as an input beam a hologram generated probe image wave (depicted in FIG. 1 by arrows 24) from the hologram 12. The path from the hologram 12 to the PCM 16 for the probe image wave 24 includes light path 26, beam splitter 28, and light path 30.

An input object 32 is provided to the hologram 12 as an input probe image. The input probe image (depicted in FIG. 1 by arrows 34) is conveyed via light path 36 through beam splitter 28 and along path 26 to the hologram 12.

A beam splitter 38 is provided in the path 30 so that a portion of the waves emanating from the PCM 16 are directed along light path 40 (as shown by arrow 48) to a viewing plane where an output image 44 may be observed.

The operation of the system 10 will be explained by way of the following example. Assume that the hologram 12 has stored thereon an image (hereinafter referred to as the desired stored image) in the form of a square with a triangle contained therein, and that this image was stored using a stored-image-associated reference beam in the form of a plane wave. The hologram 12 may also contain other stored images, each stored using a unique reference beam.

Assume further that the input object 32 includes a portion of the desired stored image, for example, just the square portion without the triangle. It is a feature of the associative memory 10 that when presented with an input object resembling a stored object, it will retrieve that stored object. This operation is accomplished as follows.

The input object 32, in the form of a square, is presented as a probe image 34 to the hologram 12 via light paths 36 and 26. In response to this probe image, the hologram 12 produces a probe reference beam 18 which is focused on PCM 14 by lens 22. Since the probe image 34 contains a portion of the desired stored image, the probe reference beam 18 will be similar to but not identical to the stored-image-associated reference beam. It may be shown by correlation theory that the stored-image-associated component of the probe reference beam will be of higher intensity than the remaining components of the probe reference beam.

As described earlier, the properties of the PCM 14 can be constructed to include thresholding, amplification, and phase conjugation of the input beam. Accordingly, the probe reference beam 18 is amplified, and only those components which exceed a predetermined threshold of intensity are conjugated. The thresholding process acts to enhance those components of the probe reference which correlate most closely to the stored-image-associated reference. The amplification acts to overcome the losses in the hologram 12. The phase conjugation acts to correct for abberations and distortions of the stored-image-associated reference (e.g. beam divergence).

The resultant phase conjugated beam (depicted by arrows 46 in FIG. 1) is returned exactly to its point of origin, the hologram 12, by the PCM 14. The beam 46 is hereinafter referred to as the restored probe reference beam since the thresholding and phase conjugation performed by PCM acts in a manner to restore the reference beam 18 to the desired stored-image-associated reference.

The restored beam 46 impinges on the hologram 12, causing it to produce a probe image 24 which is conveyed to the PCM 16 via light path 26, beam splitter 28 and light path 30. The PCM 16 phase conjugates the probe image 24, thus correcting for abberations and distortions, and returns a restored probe image, depicted by arrows 48, to the hologram 12.

The processes described above for the system 10 repeat, whereby the restored probe image causes the hologram 12 to produce a probe reference beam 18 which is even more closely correlated to the desired stored-image-associated reference. The reference beam 18 is further enhanced by the PCM 14 and returned to the hologram 12.

The reader will appreciate that the system 10 acts as a phase conjugate resonator. Resonance is sustained by assuring that the amplification level of the PCM 14 is sufficient to overcome the losses in the hologram 12 and the PCM 16. The resonant nature of the system 10 causes, for each pass of the beams through the system, the probe reference and image beams to eventually converge to the stored-image-associated reference and the stored image, respectively. The desired stored image thus appears as the output image 44.

Figure 2:
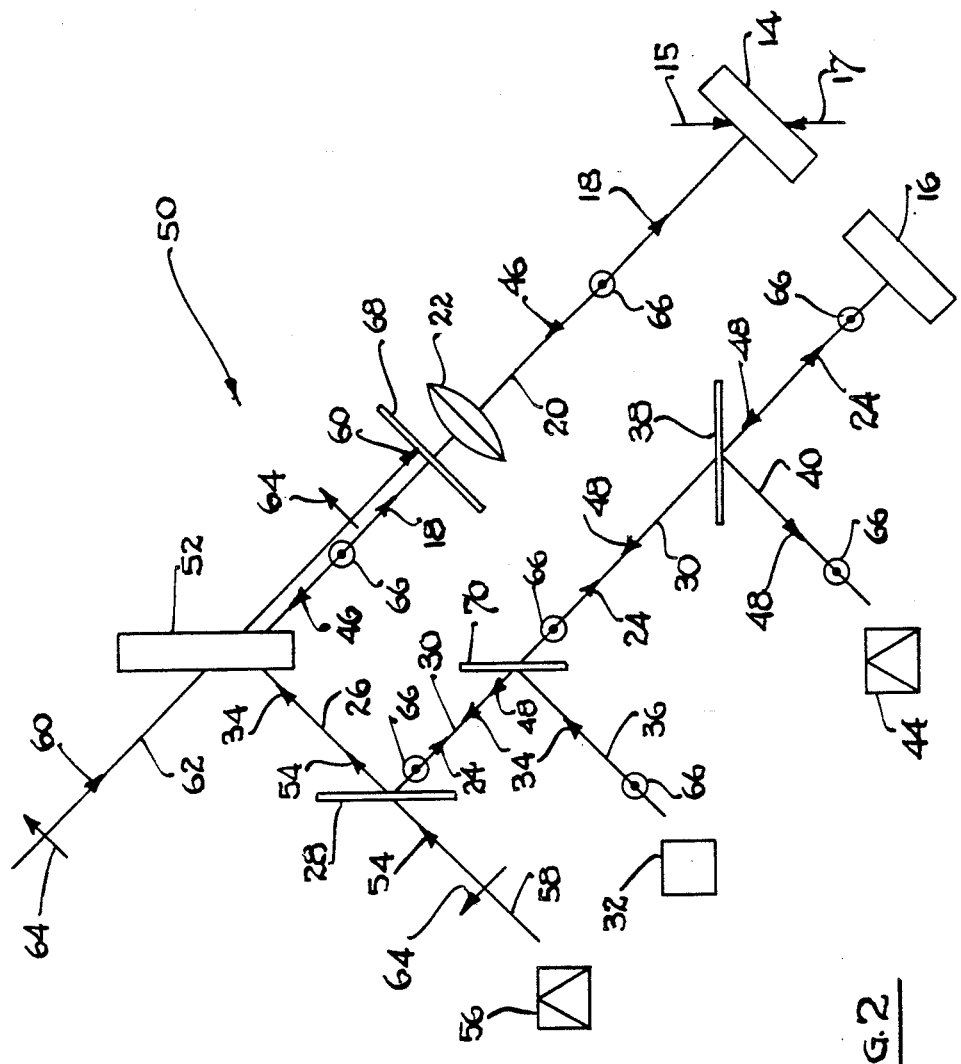
FIG. 2 is a schematic/block diagram of a second embodiment of the invention in which the permanent hologram of the embodiment of FIG. 1 is replaced by a multiple storage and erasure hologram.

In the embodiment 10, a permanent hologram 12 was employed, in which images were permanently stored. The present invention may also be used in conjunction with a multiple storage and erasure hologram. A schematic/block diagram of such an implementation 50 is shown in FIG. 2. The construction and operation of the implementation 50 is substantially identical to that of the system 10, with the following differences.

A multiple storage and erasure hologram 52 replaces the permanent hologram 12 of FIG. 1. The hologram 52 may be formed, for example, of one of a number of photorefractive crystals. A description of such holograms may be found in the paper by D. L. Staebler, W. J. Burke, W. Phillips, and J. J. Amodei entitled "Multiple Storage and Erasure of Fixed Holograms in FE-doped $LiNbO_3$," Applied Physics Letters, Vol. 26, No. 4, Feb. 15, 1975.

Briefly, images are stored in the hologram 52 by illuminating it with the image to be stored and a reference wave. Removal of these beams causes the stored image to be erased, whereupon new images may be stored. In certain photorefractive crystals, elevation of the crystal temperature may be used to cause the hologram to retain the stored image, as described in the above referenced paper.

Referring to FIG. 2, an image (depicted by arrow 54) of the object to be stored 56 is provided to the hologram 52 via light paths 58 and 26. A stored-image-associated-reference beam, depicted by arrow 60, is provided to the hologram 52 via light path 62. The beams 54 and 60 may be thought of as write beams since they act to write the stored image 54 onto the hologram.

In order to avoid interactions between the write beams and the other beams in the system 50, the write beams are polarized in a first direction, indicated by arrows 64, while the remaining beams in the system 50 are polarized in a second direction, indicated by circles 66, which is orthogonal to the first direction. The reference write beam 60 is thus prevented from interacting with the probe and restored reference beams 18 and 46, respectively, by polarizer 68.

In a manner analogous to the system 10, an input object 32 which includes a portion of the desired stored object 56 is provided as input probe image 34 to the hologram 52 via path 36, beam splitter 70, path 30, beam splitter 28, and path 26. The remainder of the system 50 behaves in the same manner as that described for the system 10. Thus, the restored probe image beams 48 from the PCM 16 converge to the desired stored object 56, which is viewable as output image 44. The ability of the system 50 to provide multiple storage and erasure of images enables the system 50 to be used as a real time associative memory having a myriad of applications in pattern recognition systems.

Figure 3:
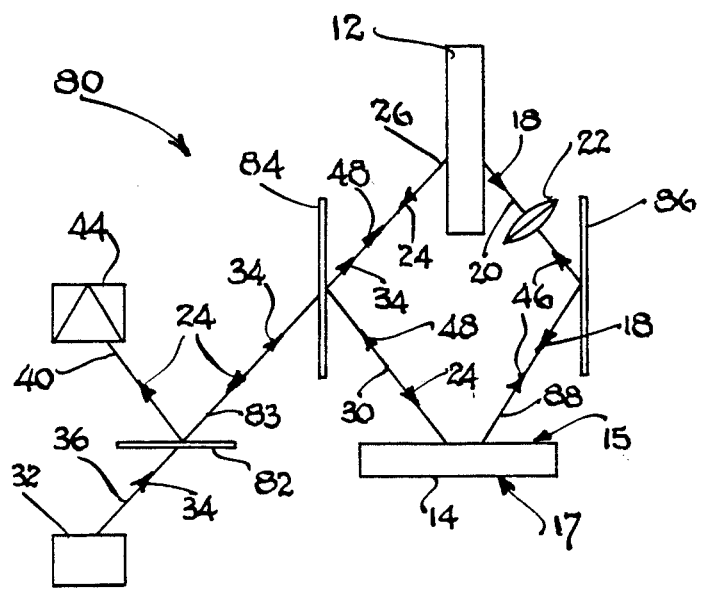
FIG. 3 is a schematic/block diagram of a third embodiment of the invention which employs only one phase conjugate mirror in a dual role.

Another embodiment 80 of the invention, employing only a single phase conjugate mirror 14 is shown in the schematic/block diagram of FIG. 3. In this embodiment, the input image 34 of the input object 32 is provided to the hologram 12 via light path 36, beam splitter 82, light path 83 and light path 24. Probe reference beam 18 generated by hologram 12 is provided to PCM 14 via light path 20, focusing lens 22, plane mirror 86, and light path 88. Restored probe reference beam 46 is returned to hologram 12 by PCM 14 via these same paths.

Probe image beam 24 generated by hologram 12 is provided to PCM 14 via light path 26, beam splitter 84 and light path 30. Restored probe beam 48 is returned to hologram 12 by PCM 24 via these same paths.

The output image 44 is obtained by viewing the probe image beam 24 from the hologram 12 via light path 26, beam splitter 84, light path 83, beam splitter 82, and light path 40. It will be appreciated that the single PCM 14 is used in the embodiment 80 to restore both the probe reference and image beams. This is feasible because of the property of the PCM that it will return a phase conjugate of an input beam to its source, regardless of the angle of incidence of that input beam.

The applications for the embodiment 80 are more limited than those of the previously described embodiments because the same PCM is used to restore both reference and image beams as well as thresholding the reference beams. For example, in the previous embodiments, the PCMs 14 and 16 can each be separately optimized in their characteristics to obtain a wider range of system performance. While the system 80 is shown using a permanent hologram 12, the multiple storage and erasure hologram 52 may also be employed.

In describing the various embodiments of the invention, the examples used assumed that the input image included a portion of the stored image. In fact, the input image need only resemble one of the stored images in some characteristic. The various systems will then provide as an output image that stored image which is most closely associated with the input image.

The examples used above also assumed that the stored-image-associated reference wave was a simple plane wave. In fact, this reference wave can be an image of another object or can be an image of the same stored object with which it is associated. Thus, heteroassociative memories may be formed.

Due to the PCM characteristic that it will return a conjugate beam to the origin of the input beam, the components of the systems described above are, for the most part, self-aligning. Alignment is required, however, between the input object 32 and the stored image in the hologram 12. It may be shown that the performance of the embodiments of the present invention will be insensitive to shifts in the input object which are within a distance which is the reciprocal of the spatial frequency bandwidth of the input object.

In order to further increase the invariance to shifts in the position of the input object, Fourier holograms, well known to those skilled in the art, rather than Fresnel holograms, may be employed.

While the invention is disclosed and particular embodiments are described in detail, it is not intended that the invention be limited solely to these embodiments. Many modifications will occur to those skilled in the art which are within the spirit and scope of the invention. It is thus intended that the invention be limited in scope only by the appended claims.

What is claimed is:

1. Associative holographic memory apparatus for reconstructing a stored image in response to an input image containing a portion or distorted version of the stored image, said apparatus comprising:
    first phase conjugate mirror means having a threshold, for generating a phase conjugate image of a portion of an image incident thereupon which exceeds said threshold;
    second phase conjugate mirror means disposed distal from said first phase conjugate mirror means and forming a phase conjugate resonator therewith, for generating a phase conjugate image in response to an image incident thereupon;
    holographic storage means disposed between said first and second phase conjugate mirror means, for storing at least one image therein;
    input image source means for applying an input image to said holographic storage means which comprises a portion or distorted version of the image stored in said holographic storage means; and
    output coupling means disposed between said first and second phase conjugate mirror means, for providing an output image from said apparatus which comprises a reconstructed image of the image stored in said holographic storage means corresponding to said input image.

2. The apparatus of claim 1 wherein said holographic storage means comprises a fixed hologram.

3. The apparatus of claim 1 wherein said holographic storage means comprises a multiple storage and erasure hologram.

4. The apparatus of claim 1 wherein said holographic storage means comprises a Fourier hologram.

5. The apparatus of claim 1 wherein said holographic storage means comprises a Fresnel hologram.

6. The apparatus of claim 1 wherein said holographic storage means comprises a photorefractive crystal.

7. The apparatus of claim 1 wherein said holographic storage means comprises photographic film.

8. Associative holographic memory apparatus for reconstructing a stored image in response to an input image containing a portion or a distorted version of one of a plurality of stored images, said apparatus comprising:
    first phase conjugate mirror means having a threshold, for preferentially generating a phase conjugate image of a portion of an image incident thereupon which exceeds said threshold;
    second phase conjugate mirror means disposed distal from said first phase conjugate mirror means and forming a phase conjugate resonator therewith, for generating a phase conjugate image in response to an image incident thereupon;
    holographic storage means disposed between said first and second phase conjugate mirror means, for storing a plurality of unique images therein;
    input image source means for applying an input image to said holographic storage means which comprises a portion or distorted version of a unique image stored in said holographic storage means; and
    output coupling means disposed between said first and second phase conjugate mirror means for providing an output image from said apparatus which comprises a reconstructed image of the image stored in said holographic storage means corresponding to said input image.

9. Associative holographic memory apparatus for reconstructing a stored image in response to an input image containing a portion or distorted version of one of a plurality of stored images, said apparatus comprising:
    holographic storage means for storing a plurality of unique images therein, each of said images being recorded with a unique reference beam;
    first phase conjugate mirror means having a threshold and disposed adjacent to one end of said holographic storage means, for preferentially generating a phase conjugate image of a portion of an image incident thereupon that has a component which is above said threshold, and for simultaneously suppressing the generation of phase conjugate images of other portions of said image;

second phase conjugate mirror means disposed adjacent to the other end of said holographic storage means and forming a phase conjugate resonator with said first phase conjugate mirror means, for generating a phase conjugate image in response to an image incident thereupon;

input image source means for applying an input image to said holographic storage means which comprises a portion or distorted version of one of said unique images stored in said holographic storage means; and output coupling means disposed between said first and second phase conjugate mirror means, for providing an output image from said apparatus which comprises a reconstructed image of said unique image stored in said holographic storage means corresponding to said input image.

10. Associative holographic memory apparatus for reconstructing a stored image in response to an input image containing a portion or distorted version of the stored image, said apparatus comprising:

holographic storage means for storing a plurality of unique images therein, each of said images being recorded with a unique reference beam;

input image source means for applying an input image to said holographic storage means which comprises a portion or distorted version of one of said unique images stored in said holographic storage means;

first phase conjugate mirror means having a threshold and disposed adjacent to one end of said holographic memory means, for preferentially generating a phase conjugate image of a portion of an image incident thereupon that has a component of a reference beam which is above said threshold, and for simultaneously suppressing the generation of other phase conjugate images corresponding to other reference beams which are incident thereupon;

second phase conjugate mirror means disposed adjacent to the other end of said holographic storage means and forming a phase conjugate resonator with said first phase conjugate mirror means, for generating a phase conjugate image in response to an image incident thereupon; and output coupling means disposed between said first and second phase conjugate mirror means, for providing an output image from said apparatus comprising a reconstructed image of said unique image stored in said holographic storage means;

whereby said input image interacts with said holographic storage means to produce a plurality of diffracted images which comprise a plurality of reference beams, one of which corresponds to said unique image that is associated with said input image, said first phase conjugate mirror means preferentially reflecting the reference beam associated with said unique image and suppressing reflection of all other reference beams incident thereupon associated with other images stored in said holographic storage means, said reflected reference beam interacting with said holographic storage means and diffracting an improved image of said unique image which is transmitted to and is reflected from said second phase conjugate mirror means back through said resonator, and whereby the continued reflection of said phase conjugated images and reference beams within said phase conjugate resonator operates to reconstruct said unique image stored in said holographic storage means from the input image which comprises only a portion of or distorted version of the information contained in said unique image.

11. Associative holographic memory apparatus for reconstructing a stored image in response to an input image containing a portion or distorted version of the stored image, said apparatus comprising:

holographic storage means for storing a plurality of unique images therein, each of said images being recorded with a unique reference beam;

input image source means for applying an input image to said holographic storage means which comprises a portion or distorted version of one of said unique images stored in said holographic storage means;

said holographic storage means being adapted to provide a reference image in response to said input image which corresponds to a plurality of reference beams, one of which is uniquely associated with said input image;

first phase conjugate mirror means having a threshold and disposed adjacent to one end of said holographic memory means, for preferentially generating a phase conjugate image of a portion of said reference image incident thereupon that corresponds to a reference beam which is above said threshold and which correlates to the stored image corresponding to said image, and for simultaneously suppressing the generation of other phase conjugate images corresponding to other reference beams that correlate to other stored images which are incident thereupon;

second phase conjugate mirror means disposed adjacent to the other end of said holographic storage means and forming a phase conjugate resonator with said first phase conjugate mirror means for generating a phase conjugate image in response to an image incident thereupon; and output coupling means disposed between said first and second phase conjugate mirror means, for providing an output image from said apparatus comprising a reconstructed image of said unique image stored in said holographic storage means;

whereby said input image interacts with said holographic storage means to produce a plurality of diffracted images which comprise a plurality of reference beams corresponding to the plurality of unique reference beams used to record said images, one of which corresponds to said unique image that is associated with said input image, said first phase conjugate mirror means preferentially reflecting the diffracted reference beam associated with said unique image and suppressing reflection of all other reference beams incident thereupon associated with other images stored in said holographic storage means, said reflected phase conjugated reference beam interacting with said holographic storage means and diffracting an improved image of said unique image which is transmitted to and is reflected from said second phase conjugate mirror means back through said resonator, and whereby the continued reflection of said phase conjugated images and phase conjugated reference beams within said phase conjugate resonator operates to reconstruct said unique image stored in said holographic storage means from the input image.

12. Associative holographic memory apparatus for reconstructing stored information in response to input information comprising a portion or distorted version of the stored information, said apparatus comprising:

first phase conjugate mirror means having a threshold, for preferentially generating a phase conjugate image of a portion of an image incident thereupon which exceeds said threshold;

second phase conjugate mirror means disposed distal from said first phase conjugate mirror means and forming a phase conjugate resonator therewith, for generating a phase conjugate image in response to an image incident thereupon;

holographic storage means disposed between said first and second phase conjugate mirror means for storing information in a plurality of unique images therein;

input means for applying input information to said holographic storage means which comprises a portion or distorted version of information stored in said holographic storage means; and output coupling means disposed between said first and second phase conjugate mirror means, for providing an output image from said apparatus comprising a reconstructed image of the information stored in said holographic storage means corresponding to said input information.

* * * * *